US007078159B2

(12) United States Patent
Simons et al.

(10) Patent No.: US 7,078,159 B2
(45) Date of Patent: Jul. 18, 2006

(54) METHOD FOR THE PREPARATION OF A PRINTING PLATE

(75) Inventors: Michael J. Simons, Middlesex (GB); Sheena Zuberi, London (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/628,853

(22) Filed: Jul. 28, 2003

(65) Prior Publication Data

US 2004/0018447 A1 Jan. 29, 2004

(30) Foreign Application Priority Data

Aug. 2, 2002 (GB) .................................... 0217976

(51) Int. Cl.
*G03F 7/26* (2006.01)

(52) U.S. Cl. ...................... 430/302; 101/453; 101/457; 101/463.1; 101/465; 101/466; 101/467

(58) Field of Classification Search ................ 430/302; 101/453, 457, 463.1, 465, 466, 467
See application file for complete search history.

(56) References Cited

U.S. PATENT DOCUMENTS

| | | | | |
|---|---|---|---|---|
| 3,574,297 | A * | 4/1971 | Bozer | 101/451 |
| 4,729,310 | A | 3/1988 | Love, III | 101/157 |
| 6,131,514 | A | 10/2000 | Simons | 101/466 |
| 6,451,413 | B1 * | 9/2002 | Aurenty et al. | 428/195.1 |
| 6,457,413 | B1 * | 10/2002 | Loccufier et al. | 101/466 |
| 6,523,472 | B1 * | 2/2003 | Loccufier et al. | 101/466 |
| 6,523,473 | B1 * | 2/2003 | Loccufier et al. | 101/466 |
| 6,523,886 | B1 * | 2/2003 | Hoffner et al. | 296/203.02 |
| 6,532,871 | B1 * | 3/2003 | Aurenty et al. | 101/465 |
| 6,662,723 | B1 * | 12/2003 | Loccufier et al. | 101/465 |
| 6,691,618 | B1 * | 2/2004 | Deutsch et al. | 101/465 |
| 6,758,140 | B1 * | 7/2004 | Szumla et al. | 101/466 |
| 6,772,687 | B1 * | 8/2004 | Damme et al. | 101/465 |
| 2004/0020388 | A1 * | 2/2004 | Simons | 101/463.1 |

FOREIGN PATENT DOCUMENTS

| | | | |
|---|---|---|---|
| EP | 0 882 584 A1 | | 12/1998 |
| EP | 1 157 825 A1 | | 11/2001 |
| EP | 1 157 828 A1 | * | 11/2001 |
| JP | 53-15905 | | 2/1978 |
| WO | WO 00/37261 | | 6/2000 |

OTHER PUBLICATIONS

JP Abstract 56-105960.

* cited by examiner

*Primary Examiner*—Barbara L. Gilliam

(57) ABSTRACT

The invention relates to a method for the preparation of a printing plate comprises inkjet printing an oleophilic image on a surface of a support by applying to the support an aqueous solution or aqueous colloidal dispersion of an oleophilising compound on the surface of the support and drying the applied solution or dispersion, such that on drying the area of the surface to which the solution or dispersion was applied becomes lithographic ink-accepting, characterised in that the oleophilising compound has the chemical structure $$MO_2C—(CHR)_l—(CHR')_m—(CHR'')_n—CO_2M$$

or $$MO_2C—(CHR)_l—(CHR')_m—(CHR'')_n—SO_3M$$

wherein each M is the same or different and is independently selected from H or a cation;

each of l, m and n independently is 0 or 1, provided that l+m+n=at least 1;

each of R, R' and R" independently is —H, —B or -L-B;

L is a linking group selected from alkylene, alkyleneoxy, thio, sulfonyl, sulfinyl, sulfoxyl, amido, alkylamido, oxyamido, alkylcarbamoyl carbamoyl, sulfonylamido, aminosulfonyl, aminosufonylamido, hydrazinyl-sufonyl, carboxyl, oxycarbonyl, carbonyl, carboxyhydrazinyl, amino, thiocarbonyl, sulfamoylamino, sulfamoyl, thiocarbamoyl, any one of said linking groups being substituted or unsubstituted; and B is a hydrophobic group comprising 8 or more carbon atoms, provided that at least one of R, R' and R" is present and has the structure —B or -L-B.

9 Claims, No Drawings

METHOD FOR THE PREPARATION OF A PRINTING PLATE

CROSS REFERENCE TO RELATED APPLICATIONS

Reference is made to commonly-assigned and copending U.S. patent application Ser. No. 10/628,192, entitled METHOD AND SUBSTRATE FOR THE PREPARATION OF A PRINTING PLATE by Michael J. Simons et al., and Ser. No. 10/628,639, entitled METHOD AND COMPOSITION FOR THE PREPARATION OF A PRINTING PLATE, by Michael J. Simons et al., both filed herewith, the disclosure(s) of which are incorporated herein.

FIELD OF THE INVENTION

This invention relates to a method for the preparation of a printing plate and to a printing plate prepared by the method.

BACKGROUND OF THE INVENTION

Printing plates suitable for offset lithographic printing are known which comprise a support having non-image areas which are hydrophilic and image areas which are hydrophobic and ink-receptive.

The art of lithographic printing is based upon the immiscibility of oil and water, wherein the oily material or ink is preferentially retained by the image area and water or fount(ain) solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper or cloth.

Commonly the ink is transferred to an intermediate material called the blanket, which in turn transfers the ink to the surface of the material upon which the image is to be reproduced.

Inkjetting is the non-impact method for producing images by the deposition of ink droplets on a substrate in response to digital signals.

JP-A-53015905 describes the preparation of a printing plate by inkjetting an alcohol-soluble resin in an organic solvent onto an aluminium printing plate.

JP-A-56105960 describes the formation of a printing plate by inkjetting onto a support, e.g. an anodised aluminium plate, an ink capable of forming an oleophilic image and containing a hardening substance such as epoxy-soybean oil, together with benzoyl peroxide or a photo-hardening substance such as an unsaturated polyester.

EP-A-0 882 584 describes a method of preparing a printing plate comprising producing an oleophilic image on the surface of a support by inkjet printing the image on the surface using an aqueous solution or of a salt of a hydrophobic organic acid, e.g. oleic acid.

U.S. Pat. No. 6,131,514 describes a method of preparing a printing plate comprising producing an oleophilic image on the surface of a support by inkjet printing the image on the surface using an aqueous solution or aqueous colloidal dispersion of a polymer bearing water-solubilising groups, wherein the water-solubilising groups interact with the surface of the support thereby binding the polymer to the support and rendering the polymer insoluble.

PROBLEM TO BE SOLVED

Inkjet printing provides a rapid and simple way of preparing a printing plate directly from digital information on a computer, which uses simpler and much less expensive equipment than commonly used computer-to-plate systems, which use high power lasers in the case of thermal effect platesetters, or lower power lasers together with a wet processing step in the case of visible light platesetters. However, it is desired to prepare plates with a long run life and with a greater tolerance to the fount solutions used on lithographic presses than those prepared using salts of mono-basic organic acids as described in EP-A-0 882 584. It is also desired to reduce the risk of the inkjet jets becoming clogged which can happen when writing fluids containing polymeric substances dry out at the writing head.

It is preferred that the inkjet writing fluids are water-based for environmental and health reasons, and also to avoid the excessive evaporation and drying-out at the jets which can occur with moderately volatile organic solvents.

SUMMARY OF THE INVENTION

The invention provides a method for the preparation of a printing plate comprising inkjet printing an oleophilic image on a surface of a support by applying to the support an aqueous solution or aqueous colloidal dispersion of an oleophilising compound on the surface of the support and drying the applied solution or dispersion, such that, on drying, the area of the surface to which the solution or dispersion was applied becomes lithographic ink-accepting, characterised in that the oleophilising compound has the chemical structure $$MO_2C—(CHR)_1—(CHR')_m—(CHR'')_n—CO_2M$$

or $$MO_2C—(CHR)_1—(CHR')_m—(CHR'')_n—SO_3M$$

wherein each M is the same or different and is independently selected from H or a cation;

each of 1, m and n independently is 0 or 1, provided that 1+m+n=at least 1;

each of R, R' and R'' independently is —H, —B or -L-B;

L is a linking group selected from alkylene, alkyleneoxy, thio, sulfonyl, sulfinyl, sulfoxyl, amido, alkylamido, oxyamido, alkylcarbamoyl carbamoyl, sulfonylamido, aminosulfonyl, aminosufonylamido, hydrazinyl-sufonyl, carboxyl, oxycarbonyl, carbonyl, carboxyhydrazinyl, amino, thiocarbonyl, sulfamoylamino, sulfamoyl, thiocarbamoyl, any one of said linking groups being substituted or unsubstituted; and B is a hydrophobic group comprising 8 or more carbon atoms, provided that at least one of R, R' and R'' is present and has the structure —B or -L-B.

DETAILED DESCRIPTION OF THE INVENTION

The carboxylic acid and sulfonic acid groups of the oleophilising compound may be wholly or partially ionised as carboxylate ions and sulfonate ions, respectively. When the acid groups are ionised, examples of M include a cation selected from substituted or unsubstituted ammonium ion and metal ions, e.g. alkali metal ions such as sodium or potassium.

In a preferred embodiment, the linking group -L is selected from alkylene, amino, amido, carbamoyl, alkylamido or alkylcarbamoyl, any one of said linking groups being unsubstituted or substituted, for example with one or more carboxylic acid or sulfonic acid groups or salts thereof. Examples of such groups include methylene ($—CH_2—$), >CHCOOH, $—NHCOCH_2—$, and $—NR'''COCH_2—$ wherein R''' is $—CH(CO_2Na)CH_2(CO_2Na)$ and $>NCOCH_2CH(CO_2Na)(SO_3Na)$.

The term hydrophobic group is widely understood in the science of surface chemistry. The hydrophobic group may be an aliphatic and/or aromatic hydrocarbon group that may be saturated or unsaturated. Preferred groups include alkyl groups having from 8 to 40 carbon atoms. The hydrophobic group may be substituted. Suitable substituents include ester, ether and substituted amide and carbamoyl groups, provided the substituents do not destroy the hydrophobic nature of the hydrophobic group. An example of a preferred substituent is $—CONHCH(COOM)_2$, wherein M is as defined above.

The oleophilising compound may have further carboxylic, sulfuric or sulfonic acid groups or salts thereof. It is necessary to retain a suitable hydrophilic-lipophilic balance in the oleophilising compound, so additional acid or acid salt groups may require larger or additional hydrophobic groups in the molecule. The further acid groups may be wholly or partially esterified. When the acid groups are esterified, examples of M include substituted or unsubstituted alkyl groups such as methyl, ethyl, propyl and butyl.

Suitable oleophilising compounds include the surfactant AEROSOL™ 22, which has the structure

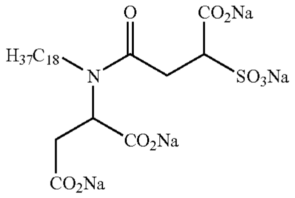

the surfactant AEROSOL™ 18, which has the structure

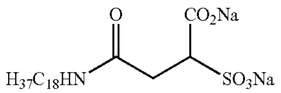

the surfactant EMCOL™ K8300, which has the structure

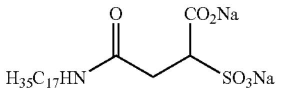

the compounds 2 to 4:

Compound 2

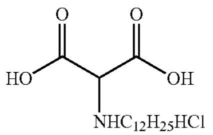

-continued

Compound 3

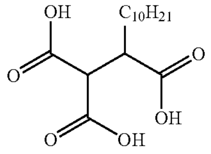

Compound 4

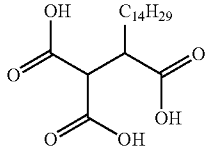

and the Compounds 5, 7, 9, 11, 12, 14, 16 and 18 whose preparation is described in Preparative Example 1, below.

It is necessary that the salt of the hydrophobic organic acid is in the form of an aqueous solution or a stable colloidal dispersion so that it can pass through the jets of the printer head.

The oleophilising compounds may be present in the aqueous composition in an amount from 0.005 to 5, preferably from 0.02 to 1% by weight.

While water is the preferred aqueous carrier medium, the aqueous composition may comprise one or more water-miscible solvents, e.g. a polyhydric alcohol such as ethylene glycol, diethylene glycol, triethylene glycol or trimethylol propane. The amount of aqueous carrier medium in the aqueous composition may be in the range from 30 to 99.995, preferably from 50 to 95% by weight.

Jet velocity, separation length of the droplets, drop size and stream stability are greatly affected by the surface tension and the viscosity of the aqueous composition. Inkjet inks suitable for use with inkjet printing systems may have a surface tension in the range from 20 to 60, preferably from 30 to 50 dynes/cm. Control of surface tensions in aqueous inks may be accomplished by additions of a small amount of surfactant(s). The level of surfactant to be used can be determined through simple trial-and-error experiments. Anionic and nonionic surfactants may be selected from those disclosed in U.S. Pat. Nos. 5,324,349; 4,156,616 and 5,279,654, as well as many other surfactants known in the inkjet art. Commercial surfactants include the SURFYNOL™ range from Air Products; the ZONYL™ range from DuPont; the FLUORAD™ range from 3M and the AEROSOL™ range from Cyanamid.

The viscosity of the ink is preferably no greater than 20 centipoise, e.g. from 1 to 10, preferably from 1 to 5 centipoise at room temperature.

The ink may comprise other ingredients. A humectant or co-solvent may be included to help prevent the ink from drying out or crusting in the orifices of the print head. A biocide, such as PROXEL™ GXL from Zeneca Colours, may be added to prevent unwanted microbial growth that may occur in the ink over time. Additional additives that may be optionally present in the ink include thickeners, pH adjusters, buffers, conductivity-enhancing agents, anti-kogation agents, drying agents and defoamers.

The aqueous composition is employed in inkjet printing wherein drops of the composition are applied in a controlled fashion to the surface of the support by ejecting droplets from a plurality of nozzles or orifices in a print head of an inkjet printer.

Commercially available inkjet printers use several different schemes to control the deposition of the ink droplets. Such schemes are generally of two types: continuous stream and drop-on-demand.

In drop-on-demand systems, a droplet of ink is ejected from an orifice directly to a position on the ink receptive layer by pressure created by, for example, a piezoelectric device, an acoustic device or a thermal process controlled in accordance with digital signals. An ink droplet is not generated and ejected through the orifices of the print head unless it is needed. Inkjet printing methods and related printers are commercially available and need not be described in detail.

The aqueous composition may have properties compatible with a wide range of ejecting conditions, e.g. driving voltages and pulse widths for thermal inkjet printers, driving frequencies of the piezoelectric element for either a drop-on-demand device or a continuous device, and the shape and size of the nozzle.

The support may be any support suitable for printing plates. Typical supports include metallic and polymeric sheets or foils, polyester films and paper-based supports.

A support having a metallic surface may be used. Preferably, the metallic surface is oxidised.

In a preferred embodiment of the invention, a support having an anodized aluminium surface is employed. A lithographic printing plate having an anodized aluminium surface is typically formed of aluminium that has been grained, for example, by electrochemical graining and then anodized, for example, by means of anodizing techniques employing sulfuric acid and/or phosphoric acid. Methods of both graining and anodizing are very well known in the art and need not be further described herein.

In another preferred embodiment of the invention, the support bears a hydrophilic coating comprising at least one hydrophilic layer on its surface and the inkjet writing fluid is jetted onto the hydrophilic layer, which is rendered oleophilic where the fluid is applied. The hydrophilic layer may comprise water-soluble polymers such as gelatin or polyvinyl alcohol and the polymers may be crosslinked to render them insoluble once dried. The layer may contain inorganic particles such as silica, alumina, titanium dioxide or kaolin. Hardened hydrophilic layers containing inorganic particles are disclosed by Staehle in U.S. Pat. No. 3,971,660.

A coated hydrophilic layer suitable for the invention may or may not comprise a crosslinked cationic polymer, in particular polyethyleneimine, as described in commonly-assigned and copending U.S. patent application Ser. No. 10/628,192, entitled METHOD AND SUBSTRATE FOR THE PREPARATION OF A PRINTING PLATE by Michael J. Simons et al., filed herewith.

After writing the image to the printing plate, the printing plate may be inked with printing ink in the normal way and the plate used on a printing press. Before inking, the plate may be treated with an aqueous solution of natural gum such as gum acacia, or of a synthetic gum such as carboxymethyl cellulose, as is well known in the art of printing—see for example Chapter 10 of "The Lithographer's Manual", edited by Charles Shapiro and published by The Graphic Arts Technical Foundation, Inc., Pittsburgh, Pa. (1966).

The invention is further illustrated by way of example as follows.

PREPARATIVE EXAMPLES

Compound 5

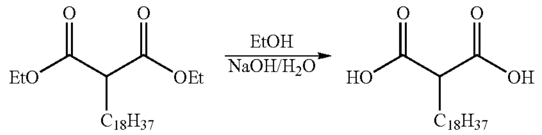

Compound 5

A solution of 2-octadecylpropanedioic acid diethyl ester (1.5 g, 3.64 mmol) in EtOH (8 ml) was added dropwise to a solution of NaOH (291mg, 7.27 mmol) in a mixture of EtOH and water (13:1.7 ml) and the solution stirred for 18 h. The solvent was removed under reduced pressure, the residue diluted with water and extracted with dichloromethane (DCM). The aqueous phase was acidified with dilute HCl, extracted with ethyl acetate (EtOAc), dried ($MgSO_4$). Removal of the solvent under reduced pressure yielded the desired product as a white solid (1.20 g, 93%).

Compound 6 (Intermediate)

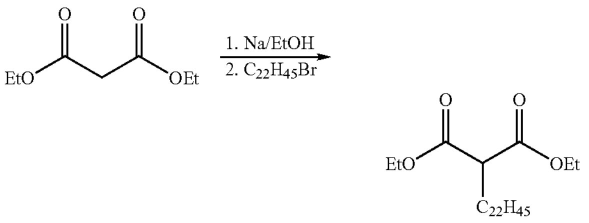

Compound 6

A solution of diethylmalonate (10 g, 62 mmol) in EtOH (10 ml) was added dropwise to a solution of NaOEt (3.83 g, 71 mmol) in EtOH (50 ml) and stirring continued at reflux for 1 h. The solution was cooled and 1-bromodocosane (26.8 g, 69 mmol) in EtOH (10 ml) was added dropwise and the solution heated at reflux for a further 18 h. The solution was filtered, the solvent removed under reduced pressure, the residue diluted with DCM, washed with water, 2M NaOH solution, dried ($MgSO_4$) and concentrated under reduced pressure to give the product as a clear oil which was used without further purification.

Compound 7

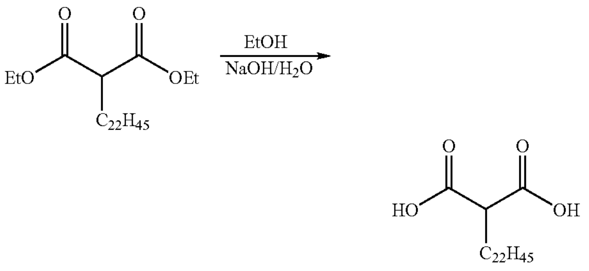

Compound 7

A solution of compound 6 (1.60 g, 3.41 mmol) in EtOH (7.5 ml) was added dropwise to a solution of NaOH (341 mg, 8.53 mmol) in a mixture of EtOH and water (15:2 ml) and the solution stirred for 18 h. The solvent was removed under reduced pressure and the residue diluted with water and extracted with DCM. The aqueous phase was acidified with dilute HCl, extracted with EtOAc, dried ($MgSO_4$) and concentrated under reduced pressure to yield the desired product as a white solid (1.35 g, 96%).

Compound 8 (Intermediate)

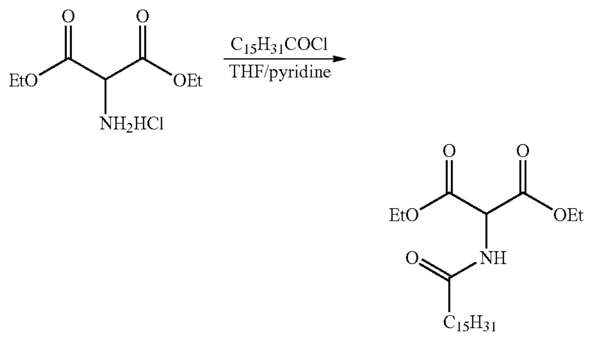

Compound 8

A solution of palmitoyl chloride (2.58 g, 9.48 mmol) in tetrahydrofuran (THF) (43 ml) was added dropwise to a solution of diethylaminomalonate hydrochloride (2 g, 9.48 mmol) in pyridine (43 ml) at room temperature and stirring continued for 18 h. The reaction mixture was poured into $H_2O$:HCl (1000:100 ml), stirred for 3 h, and the solid collected by filtration to give the desired product as a white solid (3.81 g, 97%).

Compound 9

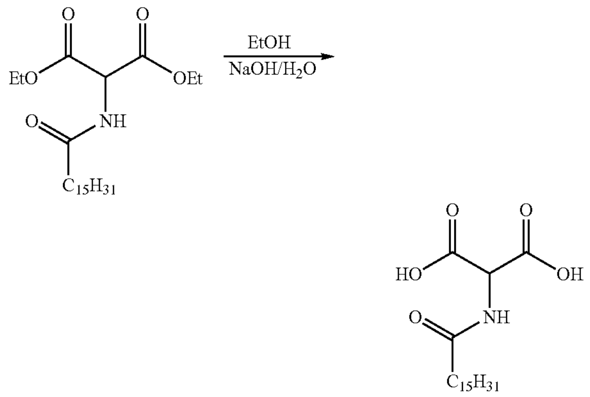

Compound 9

A solution of Compound 8 (1.5 g, 3.65 mmol) in EtOH (8 ml) was added dropwise to a solution of NaOH (320 mg, 7.99 mmol) in a mixture of EtOH and water (18:2 ml) and the solution stirred for 18 h. The solvent was removed under reduced pressure and the residue diluted with water and extracted with DCM. The aqueous phase was acidified with dilute HCl, extracted with EtOAc, dried ($MgSO_4$) and concentrated under reduced pressure to yield the desired product as a white solid (1.25 g, 100%).

Compound 10

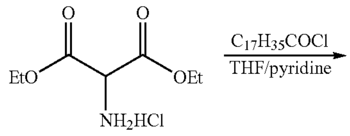

-continued

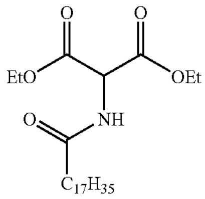

Compound 10

A solution of stearic acid (5 g, 17.61 mmol) in thionyl chloride (35 ml) was stirred at reflux for 1 h, the solvent removed under reduced pressure and the residue stripped with petrol to give the acid chloride. A solution of the acid chloride in THF (35 ml) was added dropwise to a solution of diethylamino-malonate hydrochloride (3.73 g, 17.61 mmol) in pyridine (35 ml) at room temperature and stirring continued for 18 h. The reaction mixture was poured into $H_2O$:HCl (1000:100 ml), stirred for 3 h and the solid collected by filtration. Recrystallisation (MeOH) gave the desired product as a white solid (3.47 g, 45%).

Compound 11

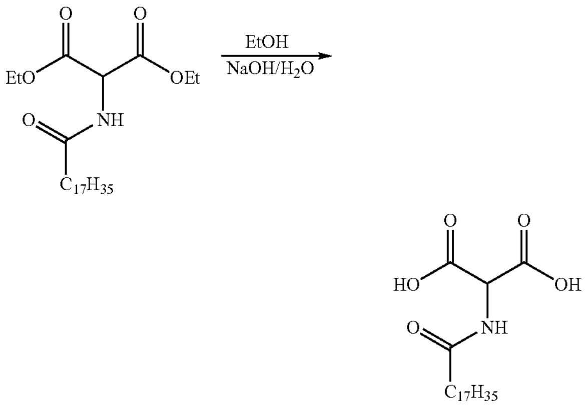

Compound 11

A solution of Compound 10 (3 g, 6.8 mmol) in EtOH (14 ml) was added dropwise to a solution of NaOH (600 mg, 14.97 mmol) in a mixture of EtOH and water (20:4 ml) and the solution stirred at 60° for 18 h. The solvent was removed under reduced pressure and the residue diluted with water and extracted with DCM. The aqueous phase was acidified with 2M HCl, extracted with EtOAc, dried ($MgSO_4$). Removal of the solvent under reduced pressure yielded the desired product as a white solid (2.3 g, 88%).

Compound 12

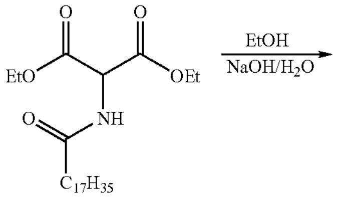

-continued

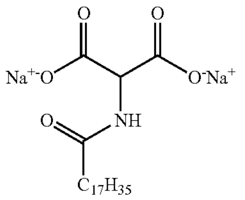

Compound 12

A solution of Compound 10 (1.5 g, 3.90 mmol) in EtOH (7.0 ml) was added dropwise to a solution of NaOH (300 mg, 7.49 mmol) in a mixture of EtOH and water (10:2 ml) and the solution stirred at 60° for 18 h. The solvent was removed under reduced pressure to the yield the product as a white solid (1.23, 97%).

Compound 13 (Intermediate)

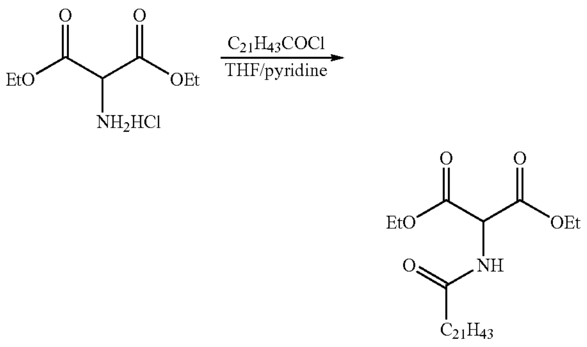

Compound 13

A solution of behemic acid (5 g, 14.68 mmol) in thionyl chloride (30 ml) was stirred at reflux for 1 h, the solvent removed under reduced pressure and the residue stripped with petrol to give the acid chloride.

A solution of the acid chloride in THF (35 ml) was added dropwise to a solution of diethylamino malonate hydrochloride (3.11 g, 14.68 mmol) in pyridine (35 ml) at room temperature and stirring continued for 18 h. The reaction mixture was poured into water:HCl (1000:100 ml), stirred for 3 h and the solid collected by filtration. Recrystallisation (methyl alcohol) gave the desired product as a white solid (8 g, 100%).

Compound 14

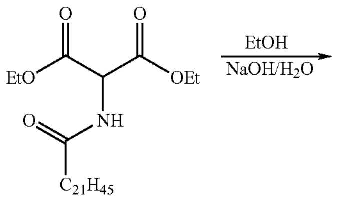

-continued

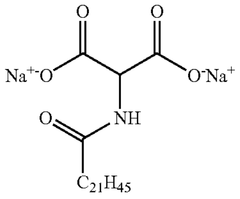

Compound 14

A solution of Compound 13 (2.0 g, 4.02 mmol) in EtOH (8 ml) was added dropwise to a solution of NaOH (354 mg, 8.85 mmol) in EtOH and water (15:2 ml) and the solution stirred at 35° for 18 h. The solvent was removed under reduced pressure to the yield the product as a white solid (1.65 g, 93%).

Compound 15 (Intermediate)

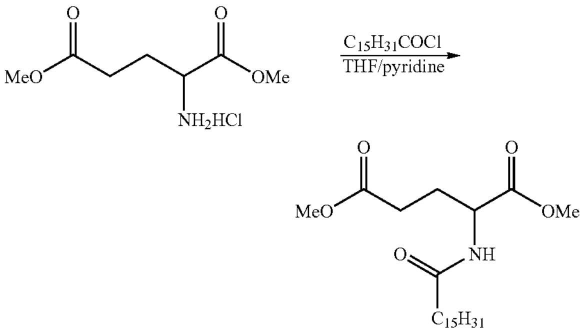

Compound 15

A solution of palmitoyl chloride (6.47 g, 23.62 mmol) in THF (60 ml) was added dropwise to a solution of L-glutamic acid dimethyl ester (5.0 g, 23.62 mmol) in pyridine (60 ml) at room temperature and stirring continued for 18 h. The reaction mixture was poured into water:HCl (1000:100 ml), stirred for 3 h and the solid collected by filtration to give the desired product as a white solid (11.64 g, 100%).

Compound 16

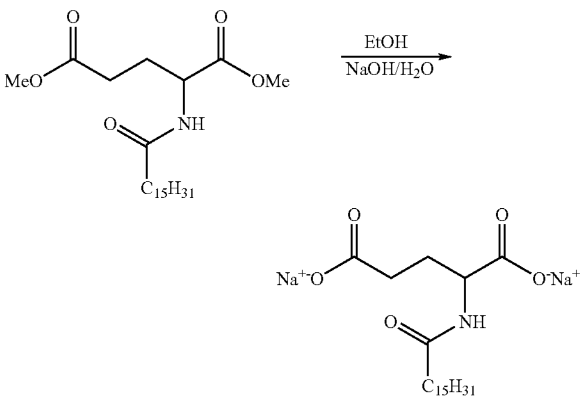

Compound 16

A solution of Compound 15 (3.0 g, 7.26 mmol) in EtOH (10 ml) was added dropwise to a solution of NaOH (640 mg, 15.98 mmol) in a mixture of EtOH and water (20:4 ml) and the solution stirred at 35° for 18 h. The solvent was removed under reduced pressure to the yield the product as a white solid (2.67 g 96%).

Compound 17 (Intermediate)

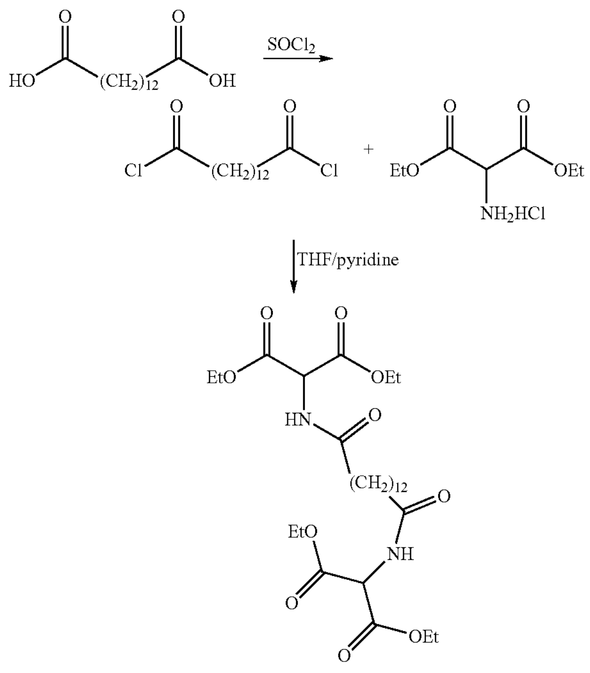

Compound 17

A solution of 1,12-dodecanoic dicarboxylic acid (2 g, 7.74 mmol) in thionyl chloride (15 ml) was stirred at reflux for 1 h, the solvent was removed under reduced pressure and the residue stripped with petrol to give the acid chloride.

A solution of the acid chloride in THF (12 ml) was added dropwise to a solution of diethylaminomalonate hydrochloride (3.28 g, 15.48 mmol) in pyridine (30 ml) at room temperature and stirring continued for 18 h. The reaction mixture was poured into water:HCl (1000:100 ml), stirred for 3 h and the solid collected by filtration to yield the required product as a white solid (4.15 g, 100%)

Compound 18

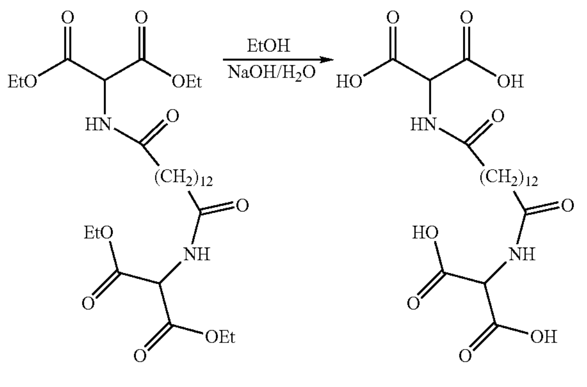

Compound 18

A solution of Compound 17 (3 g, 3.49 mmol) in EtOH (8.0 ml) was added dropwise to a solution of NaOH (840 mg, 20.97 mmol) in a mixture of EtOH and water (20:6 ml) and the solution stirred for 18 h. The solvent was removed under reduced pressure and the residue diluted with $H_2O$ and extracted with DCM. The aqueous phase was acidified with dilute HCl, extracted with EtOAc, dried ($MgSO_4$) and concentrated under reduced pressure to yield the desired product as a white solid.

Example 1

Solutions of the test compounds were prepared by dissolving them in water at a concentration of 0.5% w/w. If the test compound was in the form of a free acid, sufficient sodium hydroxide solution was added to convert all the acid to the sodium salt. Each solution was applied to a portion of a hydrophilic substrate with a small squirrel-hair paintbrush, and allowed to dry. Two hydrophilic substrates were used:

(A) grained, anodised aluminium, as commonly used for making printing plates, and (B) polyethylene terephthalate photographic film base coated from aqueous solution with the following coverages of the stated substances:

| | |
|---|---|
| Cationic colloidal silica Ludox CL ™ | 3.0 g/m$^2$ |
| Polyethyleneimine (used as a 5% w/w solution and adjusted to pH 6.5 with sulfuric acid) | 0.6 g/m$^2$ |
| bis(vinylsulfonyl)methane (hardener) | 0.05 g/m$^2$ |

hereinafter referred to as Film B.

The portions of hydrophilic substrate were gently wiped with a piece of cotton wool, which was wetted with water. A little black lithographic printing ink was then applied to the cotton wool and the inked cotton wool pad rubbed gently over the substrate. The test was then repeated except that the cotton wool was wetted with lithographic press fount solution (Varn International™ Universal Pink Fount Solution, diluted 1+15 with water).

This test was carried out with the following compounds according to the invention: AEROSOL™ 22, AEROSOL™ 18, EMCOL™ K8300 and compounds 2, 3, 4, 5, 7, 14, 16, and 18.

In the case wherein the cotton wool was wetted with water and also in the case wherein the cotton wool was wetted with fount solution, in the area of the substrate to which the solution of each oleophilising compound had been applied a clear black mark of adhering lithographic ink was observed, while the background areas of the substrate remained unmarked and wetted with water or fount solution. This demonstrated that the compounds showed an oleophilising effect on the substrates used, and so were potentially useful for making lithographic printing plates by inkjet application.

The test was also carried out with the following comparative compounds:

Sodium dodecyl sulfate

Sodium benzene dodecyl sulfate

Tri-isopropyl naphthalene sulfonate

Dioctyl sulfosuccinate, sodium salt

Sodium stearate

Comparative compound 1

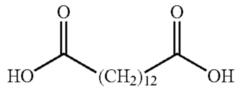

For all the comparative compounds, when the test was done using the film substrate and water as the wetting liquid, in the area of the substrate to which the solution of the test compound had been applied, a clear black mark of adhering lithographic ink was observed, while the background areas of the substrate remained unmarked and wetted with water.

However for all the comparative compounds on both film and aluminium substrates when fount solution was used as the wetting liquid, the area where the solution of compound had been applied remained clear of lithographic printing ink, no ink adhered to either substrate, demonstrating a complete absence of lithographic effect in the presence of the fount solution.

The results show how compounds for use in the invention show a much superior lithographic effect to similar compounds having only one acid group or two carboxylic acid groups spaced widely apart.

Example 2

The test described in Example 1 was carried out using a number of compounds according to the invention using hydrophilic substrate C, similar to hydrophilic substrate B, and which consisted of polyethylene terephthalate photographic film base coated from aqueous solution with the following coverages of the stated substances:

| | |
|---|---|
| Cationic colloidal silica Ludox CL ™ | 4.0 $g/m^2$ |
| Polyethyleneimine (used as a 5% w/w solution and adjusted to pH 6.5 with sulfuric acid) | 0.4 $g/m^2$ |
| bis(vinylsulfonyl)methane (hardener) | 0.033 $g/m^2$ |

hereinafter referred to as Film C.

The resulting mark of adsorbed lithographic printing ink was then subjected to a wet abrasion test to estimate its robustness. A swab of soft cotton fabric was attached to a weight and moved to-and-fro over the surface. The number of abrasion strokes required to remove the centre of the mark of adsorbed lithographic printing ink was recorded. The results were as follows as shown in TABLE 1:

TABLE 1

| Compound | Number of strokes |
|---|---|
| 2 | 10 |
| 3 | 2 |
| 4 | 2 |
| 5 | 2 |
| 7 | 2 |
| 9 | 28 |
| 11 | 42 |
| 12 | 37 |
| 14 | 50 |
| 16 | 59 |
| 18 | 84 |

Compounds 2, 9, 11, 12, 14, 16, and 18 are examples of preferred compounds in which the linking group bound to the hydrophobic group is bonded to the carbon atoms between the acid groups via a nitrogen atom. All of these showed better abrasion resistance than the substances which did not have that structure.

Example 3

An inkjet writing fluid was prepared as follows:

To 11.5 ml water was added 2.5 ml 4% w/w aqueous solution of AEROSOL™ 22, 2 ml ethanediol and 4 ml 2% w/w aqueous solution of the dye PHLOXINE™ B. (The AEROSOL™ 22 was the oleophilising compound, ethanediol a humectant and the dye was present to make the fluid visible on the plate).

The black cartridge of a Lexmark Z43 inkjet printer was emptied, the plastic foam removed, and residual ink washed out. It was refilled with the above writing fluid and a wad of cotton wool in place of the foam. The cartridge was replaced in the printer, and a test pattern was printed onto a sheet of Film B as described in Example 1.

When the test pattern had dried, the resulting polyester film printing plate was mounted on the plate cylinder of a Heidelberg T-Offset printing press, the press rollers were inked up using fount solution as described in Example 1 and K&E™ Novaquick 123W oil-based black ink, and printing started. Clean prints were obtained from the first impression and 2000 copies of the test pattern were printed without noticeable deterioration.

Example 4

Solutions of the test compounds were prepared by dissolving them in water at a concentration of 0.5% w/w. If the test compound were in the form of a free acid, sufficient sodium hydroxide solution was added to convert all the acid to the sodium salt. Each solution was applied using a small squirrel-hair paintbrush to a separate part of a grained, anodized aluminium plate so as to form a mark or pattern and allowed to dry.

The plate was mounted on the printing press as described in Example 3 and the press run as described in Example 3. Clean prints of the applied marks were obtained. The press was run for 8000 impressions and the approximate number of impressions noted when each mark showed some sign of wear. The results are shown in TABLE 2:

TABLE 2

| Compound | Number of impressions |
|---|---|
| EMCOL K8300 | 400 |
| 2 | >8000 |
| 9 | 4000 |
| 12 | 7000 |
| 18 | 400 |

The invention has been described in detail with particular reference to certain preferred embodiments thereof, but it will be understood that variations and modifications can be effected within the spirit and scope of the invention.

The invention claimed is:

1. A method for the preparation of a printing plate comprising inkjet printing an oleophilic image on a surface of a support by applying to the support an aqueous solution or aqueous colloidal dispersion of an oleophilising compound on the surface of the support and drying the applied solution or dispersion, such that on drying the area of the surface to which the solution or dispersion was applied becomes lithographic ink-accepting, characterised in that the oleophilising compound has the chemical structure $$MO_2C—(CHR)_1—(CHR')_m—(CHR'')_n—CO_2M$$

or $$MO_2C—(CHR)_1—(CHR')_m—(CHR'')_n—SO_3M$$

wherein each M is the same or different and independently selected from H or a cation;

each of 1, m and n independently is 0 or 1, provided that 1+m+n=at least 1;

each of R, R' and R'' independently is —H or -L-B;

L is a linking group selected from alkyleneoxy, thio, sulfonyl, sulfinyl, sulfoxyl, amido, alkylamido, oxyamido, alkylcarbamoyl carbamoyl, sulfonylamido, aminosulfonyl, aminosufonylamido, hydrazinyl-sufonyl, carboxyl, oxycarbonyl, carbonyl, carboxyhydrazinyl, amino, thiocarbonyl, sulfamoylamino, sulfamoyl, thiocarbamoyl, any one of said linking groups being substituted or unsubstituted; and B is a hydrophobic group comprising 8 or more carbon atoms, provided that at least one of R, R' and R'' is present and has the structure -L-B.

2. A method as claimed in claim 1 wherein the linking group L is selected from amino, amido, carbamoyl, alkylamido or alkylcarbamoyl, any one of said linking groups being substituted or unsubstituted.

3. A method as claimed in claim 1 wherein the linking group L is selected from an unsubstituted or substituted >CHCOOH, $—NHCOCH_2—$, $—NR'''COCH_2—$ wherein R''' is $—CH(CO_2Na)CH_2(CO_2Na)$, and $>NCOCH_2CH(CO_2Na)(SO_3Na)$.

4. A method as claimed in claim 1 wherein the hydrophobic group is a substituted or unsubstituted alkyl group having from 8 to 40 carbon atoms.

5. A method according to claim 1 wherein the oleophilising compound is selected from the group consisting of

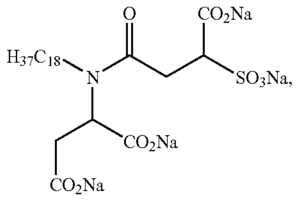

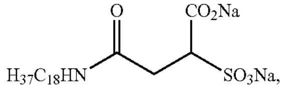

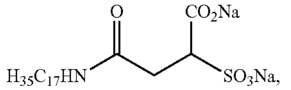

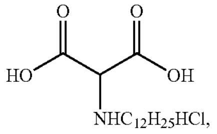

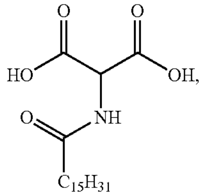

-continued

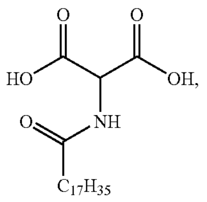

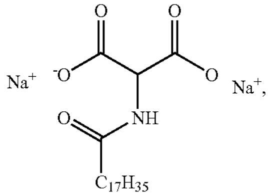

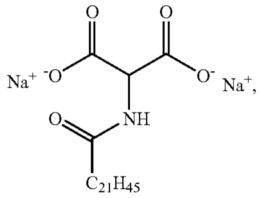

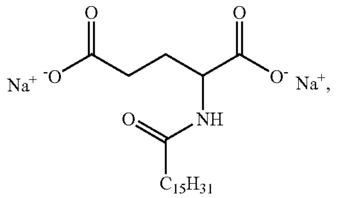

and

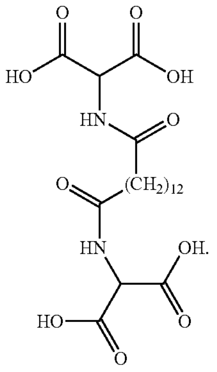

6. A method as claimed in claim 1 wherein the oleophilising compound is present in the aqueous solution or aqueous colloidal dispersion in an amount from 0.005 to 5% by weight.

7. A method as claimed in claim 1 wherein the aqueous solution or aqueous colloidal dispersion has a surface tension in the range from 20 to 60 dynes/cm.

8. A method as claimed in claim 1 wherein the support is selected from metallic and polymeric sheets and foils, polyester films, and paper-based supports.

9. A printing plate obtained by a method as claimed in claim 1.

* * * * *